(12) United States Patent
Simmons et al.

(10) Patent No.: US 7,865,148 B2
(45) Date of Patent: Jan. 4, 2011

(54) SYSTEM AND METHOD FOR ENCODING AND DECODING INFORMATION SIGNALS USING A PRIORI INFORMATION

(75) Inventors: Sean Simmons, Waterloo (CA); Yiwen Liu, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 1310 days.

(21) Appl. No.: 11/396,528

(22) Filed: Apr. 4, 2006

(65) Prior Publication Data
US 2006/0222090 A1 Oct. 5, 2006

Related U.S. Application Data

(60) Provisional application No. 60/667,681, filed on Apr. 4, 2005.

(51) Int. Cl.
*H04B 7/00* (2006.01)
(52) U.S. Cl. .......................... 455/68; 455/72; 455/410; 455/517
(58) Field of Classification Search .................. None
See application file for complete search history.

(56) References Cited

U.S. PATENT DOCUMENTS

| | | | | |
|---|---|---|---|---|
| 6,292,922 B1 * | 9/2001 | Ruscitto et al. | ............ | 714/795 |
| 6,377,553 B1 | 4/2002 | Vary et al. | | |
| 6,677,865 B1 * | 1/2004 | Xu | ............... | 341/50 |
| 7,249,311 B2 * | 7/2007 | Lamy | ........................ | 714/796 |
| 7,434,146 B1 * | 10/2008 | Verdu et al. | ................. | 714/780 |
| 2004/0032347 A1 | 2/2004 | Yamazaki | | |
| 2004/0078745 A1 | 4/2004 | Kruger et al. | | |
| 2007/0140375 A1 * | 6/2007 | Jeanne et al. | ............... | 375/295 |

OTHER PUBLICATIONS

International Searching Authority, International Search Report, Jul. 18, 2006, PCT/CA2006/000505.

International Searching Authority, The Written Opinion of the International Searching Authority, Jul. 18, 2006, PCT/CA2006/000505.

Kliewer J. et al., "Soft-Input Source Decoding for Robust Transmission of Compressed Images Using Two-Dimensional Optimal Estimation", 2001 IEEE International Conference on Acoustics, Speech, and Signal Processing, Proceedings, Salt Lake City, UT, May 7-11, 2001, vol. 1 of 6, May 7, 2001 pp. 2565-2568.

Fingscheidt, Tim et al., "Softbit Speech Decoding: A New Approach to Error Concealment", Internet article, Mar. 2001. Retrieved from the Internet: http://ieeexplore.ieee.org/ie15/89/19597/00905998.pdf.

Mertins, Alfred, "Image Recovery from Noisy Transmission Using Soft Bits and Markov Random Field Models", Internet article, Oct. 2003. Retrieved from the Internet: http://www.isip.uni-luebeck.de/uploads/tx_ckpublications/mertins-oe-oct03.pdf.

(Continued)

*Primary Examiner*—Philip J Sobutka
(74) *Attorney, Agent, or Firm*—Bereskin & Parr LLP/S.E.N.C.R.L., s.r.l.

(57) ABSTRACT

A system and method for coding and decoding an information signal sent through a communication system. The system includes: an encoder for encoding the information signal without adding additional information and for sending an encoded information signal; and a soft bit decoder including a-priori information related to the communication system for receiving the encoded information signal and decoding the encoded information signal using the a-priori information.

14 Claims, 8 Drawing Sheets

OTHER PUBLICATIONS

European Supplementary Search Report and Examination Opinion. Application No. 06721760.4. Dated: Feb. 14, 2008.

European Examination Report. Application No. 06721760.4. Dated: May 27, 2009.

Canadian First Office Action. Application No. 2,604,966. Dated: Aug. 5, 2009.

Alfred Mertins, Image Recovery from Noisy Transmission using Soft Bits and Markov Random Field Models, University of Oldenburg, School of Mathematics and Natural Sciences, Germany http://www.uni-oldenburg.de/sigproc/papers/mertins-oe-oct03.pdf, Oct. 2003

Tim Fingscheidt and Peter Vary, Softbit Speech Decoding: A New Approach to Error Concealment, IEEE Transactions on Speech and Audio Processing, vol. 9, No. 3, Mar. 2001, pp. 240-251.

Justin Dauwels et al., Synchronization of a Chaotic Dynamical System Using a Soft-Decision Receiver, Signal & Information Proc. Lab.(ISI), ETH Zentrum, (4 pages), www.media.mit.edu/rvigoda/phd/ben.vigoda.ct.n11.pdf, Jan. 2004.

Jorg Kliewer and Norbert Gortz, Soft-Input Source Decoding for Robust Transmission of Compressed Images Using Two-Dimensional Optimal Estimation, University of Kiel, Institute for Circuits and Systems Theory, Proceedings ICASSP 2001, vol. IV, May 2001, pp. 2565-2568.

Farshad Lahouti and Amir K. Khandani, Soft Reconstruction of Speech in the Presence of Noise and Packet Loss, Technical Report UW-E&CE#2003-4, Department of Electrical & Computer Engineering, University of Waterloo, May 15, 2003, pp. 1-29.

Marc Adrat et al., The EXIT-Characteristic of Softbit-Source Decoders, IEEE Communications Letters, vol. 9, No. 6, Jun. 2005, pp. 540-542.

M. Adrat et al., Softbit-Source Decoding Based on the Turbo-Principle, Institute of Communication Systems and Data Processing, Aachen, University of Technology, 2001 IEEE VTS $54^{th}$ Vehicular Technology Conference, pp. 2252-2256.

M. Adrat, et al., Iterative Source-Channel Decoder Using Extrinsic Information from Softbit-Source Decoding, Institute of Communication Systems and Data Processing, Aachen, University of Technology, 2001 IEEE International Acoustics, Speech, and Signal Processing, Proceedings (ICASSP '01), pp. 2653-2656.

M. Adrat et al., Efficient Near-Optimum Softbit Source Decoding for Sources with Inter- and Intra-Frame Redundancy, Institute of Communications Systems and Data Processing, Aachen University (RWTH), IEEE International Acoustics, Speech, and Signal Processing, 2004, Proceeding (ICASSP '04), pp. IV-653-IV-656.

* cited by examiner

SYSTEM AND METHOD FOR ENCODING AND DECODING INFORMATION SIGNALS USING A PRIORI INFORMATION

RELATED APPLICATION

This application claims the benefit under 35 USC 119(e) of earlier filed U.S. Provisional Application No. 60/667,681, filed Apr. 4, 2005, which is hereby incorporated herein by reference.

A portion of the disclosure of this patent document contains material which is subject to copyright protection. The copyright owner has no objection to the facsimile reproduction by anyone of the patent document or patent disclosure, as it appears in the Patent and Trademark Office patent file or records, but otherwise reserves all copyright rights whatsoever.

FIELD

This application relates generally to a system and method for sending information signals through a channel in a communication system, and more specifically to a system and method for coding and decoding a digital information signal making use of soft decoding.

BACKGROUND

In voice and data communications networks, there is an on-going need to minimize bandwidth requirements and improve the quality of voice or data traffic. Reducing the bandwidth is typically achieved by implementing compression algorithms to remove redundancy from a signal. On the other hand, quality is typically improved by adding redundancy to a signal by, for example, implementing error detection and correction techniques, and by recovering from errors by using lost frame concealment techniques.

Conventional systems attempt to achieve a balance between bandwidth and quality by using a combination of methods. In a conventional system, at the transmitting side, a source coder/quantizer is provided to quantize and compress the signal to be transmitted, i.e. reduce the bandwidth required, while a channel coder is provided to add information for use in error detection and correction, i.e. improve quality. The signal then travels through a channel (data link) where it may be corrupted. At the receiving side, a corresponding channel decoder and source decoder are provided to decode the signal received.

One of the issues in communication systems is that, as the interference level increases, the quality of recovered signal falls off rapidly. One conventional approach to overcome this problem has been the use of adaptive source/channel coding (e.g. GSM's Adaptive Multi-Rate [AMR]). Adaptive source/channel coding allows a variation in the level of source coding based on the amount of interference found on the channel data link. For example, a lower level of source coding is performed when the level of interference is high. This allows for more redundancy in the signal and thus, the interference will have less impact on the signal. However, this also has the effect of increasing bandwidth requirements. In a similar way, when the level of interference is low, a higher level of source coding can be used. In this way, adjustments can be made adaptively to counteract the effects of interference during signal transmission.

While adaptive source/channel coding adjusts the source coder based on interference conditions, other conventional approaches are directed to the receiver side of the channel. In a communication system, when a data bit is received, there is some uncertainty as to whether or not the bit is a 1 or a 0 due to distortion, interference, noise on the channel, or the like. In a conventional system, the channel decoder would typically examine an incoming signal and make a hard decision, that is, a final decision as to whether a particular bit received is a 1 or 0 without reference to any information other than the received bit. Thus, the output of the channel decoder would only be 0 or 1 (the output is quantized to two levels), which are called "hard-bits".

More recently, the concept of using "soft bits" has been introduced. A soft bit represents a probability that a particular bit will be either a 1 or 0. The concept of soft bits also often involves the use of various types of available information (sometimes called a-priori information) to assist with interpretation of a data stream as opposed to merely examining a particular data bit or codeword that is being processed. As a very simple example, if we assume that at the sending end, a signal value of 1V represents a bit value of 1 and −1V represents a bit value of 0, when making a hard decision for an incoming bit, a receive signal value of 0.75 Volts may be assigned a bit value of 1 and −0.25 Volts may be assigned a bit value of 0. However, in such a scenario it is difficult to assign a bit value to a signal value of 0.0 Volts. Such a determination can be more effectively made by considering a-priori information, for example, if the type of signal is known to have a higher percentage of 1's than 0's, then there may be a greater probability that a received signal of 0.0 Volts should be classified as a 1 and not a 0. As such a received bit can be quantized to a larger number of levels. Other types of information used in determining soft bit probabilities may relate to previous bits received, or, with a delay, following bits received. Overall, this additional information can be used to produce a more accurate estimate of the transmitted bit value.

A channel decoder may incorporate soft bits to become a soft channel decoder, which outputs a soft bit (i.e. a probability) rather than a hard bit (i.e. a 1 or 0). In particular, the soft channel decoder may include forward error checking (FEC) decoding with a soft-in, soft-out maximum a-posteriori probability (MAP) decoder.

In this type of system, the soft channel decoder adjusts the probabilities based on a-priori knowledge to compute adjusted output probabilities. These adjusted probabilities are then provided to a soft source decoder, which uses the probabilities to determine codeword probabilities. These codeword probabilities can be used to compute the source decoder output based on, for example, a most likely output using maximum a-posteriori probability (MAP) or by weighting the corresponding decoder outputs using a minimum mean square (MMS) approach.

Information regarding soft bits and the types and usage of a-priori information for both speech and images can be found in the following research papers and the documents that they reference. The following documents are hereby incorporated herein by reference:

T. Fringscheidt and P. Vary, Softbit Speech Decoding: A New Approach to Error Concealment, IEEE Transactions on Speech and Audio Processing, Vol. 9, No. 3, March, 2001.

F. Lahouti, A. Khandani, Soft Reconstruction of Speech in the Presence of Noise and Packet Loss, Technical Report UW-E&EC#2003-4, University of Waterloo, May 15, 2003.

A. Mertins, Image Recovery from Noisy Transmission using Soft Bits and Markov Random Field Models, University of Oldenburg School of Mathematics and Natural Sciences, GERMANY, http://www.uni-oldenburg.de/sigproc/papers/mertins-oe-oct03.pdf, October 2003.

J. Kliewer, N. Gortz, Soft-input Source Decoding For Robust Transmission Of Compressed Images Using Two-Dimensional Optimal Estimation, University of Kiel, Proceedings ICASSP 2001, vol. IV, pp. 2565-2568, Salt Lake City, Utah, USA, May 2001, http://www.Int.ei.tum.de/mitarbeiter/goertz/icassp2001.pdf.

The above conventional approaches to balancing bandwidth and quality requirements have various issues. For example, GSM's AMR solution requires complex control procedures to allow for adaptive control of the source coders and corresponding source decoders based on interference levels. Further, methods of error checking and lost frame concealment typically require increases in bandwidth requirements and processing capability.

As such, there is a need for an improved system and method for encoding and decoding information signals using soft decoding.

BRIEF DESCRIPTION OF THE DRAWINGS

For a better understanding of the following description, and to show more clearly how improved systems and methods may be carried into effect, reference will be made, by way of example, to the accompanying drawings in which.

DETAILED DESCRIPTION OF EMBODIMENTS

Figure 1:
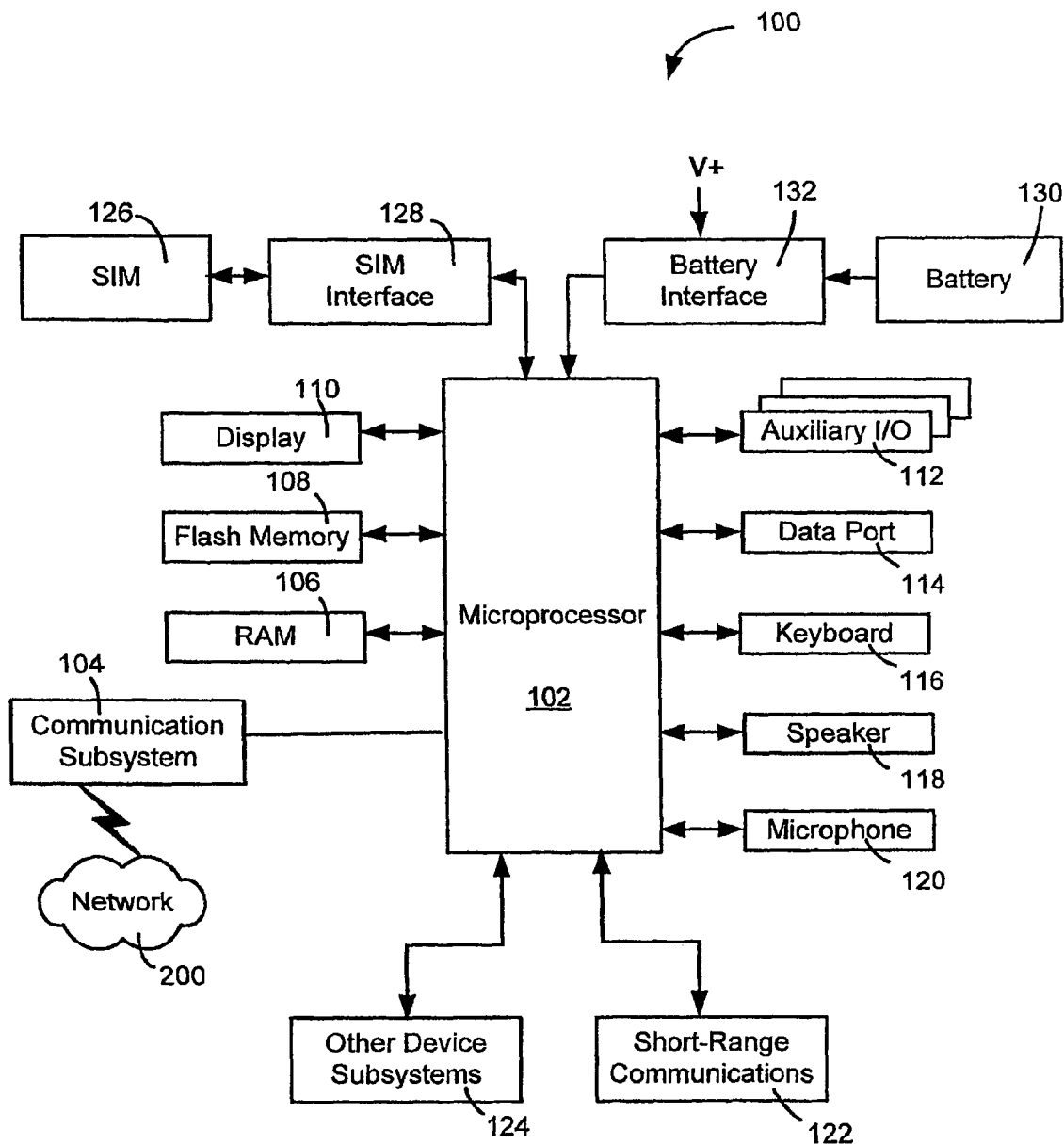
FIG. 1 is a block diagram of a mobile device in one example implementation.

According to an exemplary embodiment, there is provided a method for coding and decoding an information signal sent through a communication system. The method includes: preparing a-priori information related to the communication system; receiving an information signal; encoding the information signal at an encoder without adding additional information; sending the encoded information signal through a channel of the communication system; receiving the encoded information signal at a decoder; and decoding the encoded information signal using the a-priori information.

In an aspect of this embodiment, the a-priori knowledge related to the communication system may include a-priori knowledge related to one or more of the encoder, the channel, and a signal type of the information signal. In a particular case, the a-priori knowledge may include a probability distribution related to the encoder. In this case, the probability distribution may include a table of probabilities.

In another aspect of this embodiment, the encoding the information signal without adding additional information may involve the use of source coding without using channel coding. In a particular case, the encoding the information signal without adding additional information may involve encoding the information signal without adding forward error correction information.

In yet another aspect of this embodiment, the decoding the encoded information signal using the a-priori information may include: applying the a-priori information to the received encoded information signal to produce soft-bit probabilities; and decoding the soft-bit probabilities. In this case, the decoding the soft-bit priorities may include selecting the most likely decoder output based on maximum a-posteriori probability or based on minimum mean square or some combination thereof.

According to another exemplary embodiment, there is provided a system for coding and decoding an information signal sent through a channel of a communication system including: an encoder for encoding the information signal without adding additional information and for sending an encoded information signal; and a soft bit decoder including a-priori information related to the communication system for receiving the encoded information signal and decoding the encoded information signal using the a-priori information.

In an aspect of this embodiment the a-priori knowledge related to the communication system may include a-priori knowledge related to one or more of the encoder, the channel, and a signal type of the information signal. In a particular case, the a-priori knowledge may include a probability distribution related to the encoder. In this case, the probability distribution may include a table of probabilities.

In another aspect, the encoder may be arranged to encode the information signal without adding additional information by performing source coding without channel coding.

In yet another aspect, the encoder may be arranged to encode the information signal without adding additional information by encoding the information signal without forward error correction information.

In yet another aspect, the decoder may include: an a-priori processor for applying the a-priori information to the received encoded information signal to produce soft-bit probabilities; and a source decoder for decoding the soft-bit probabilities. In a particular case, the source decoder may be arranged to decode the soft-bit priorities by selecting the most likely decoder output based on maximum a-posteriori probability or based on minimum mean square or some combination thereof.

This detailed description continues with a general description of a mobile environment and then proceeds to describe the application of exemplary embodiments within this environment.

The mobile environment involves use of a mobile station. A mobile station is a two-way communication device with advanced data communication capabilities having the capability to communicate with other computer systems, and is also referred to herein generally as a mobile device. A mobile device may also include the capability for voice communications. Depending on the functionality provided by a mobile device, it may be referred to as a data messaging device, a two-way pager, a cellular telephone with data messaging capabilities, a wireless Internet appliance, or a data communication device (with or without telephony capabilities). A mobile device communicates with other devices through a network of transceiver stations.

Figure 2:
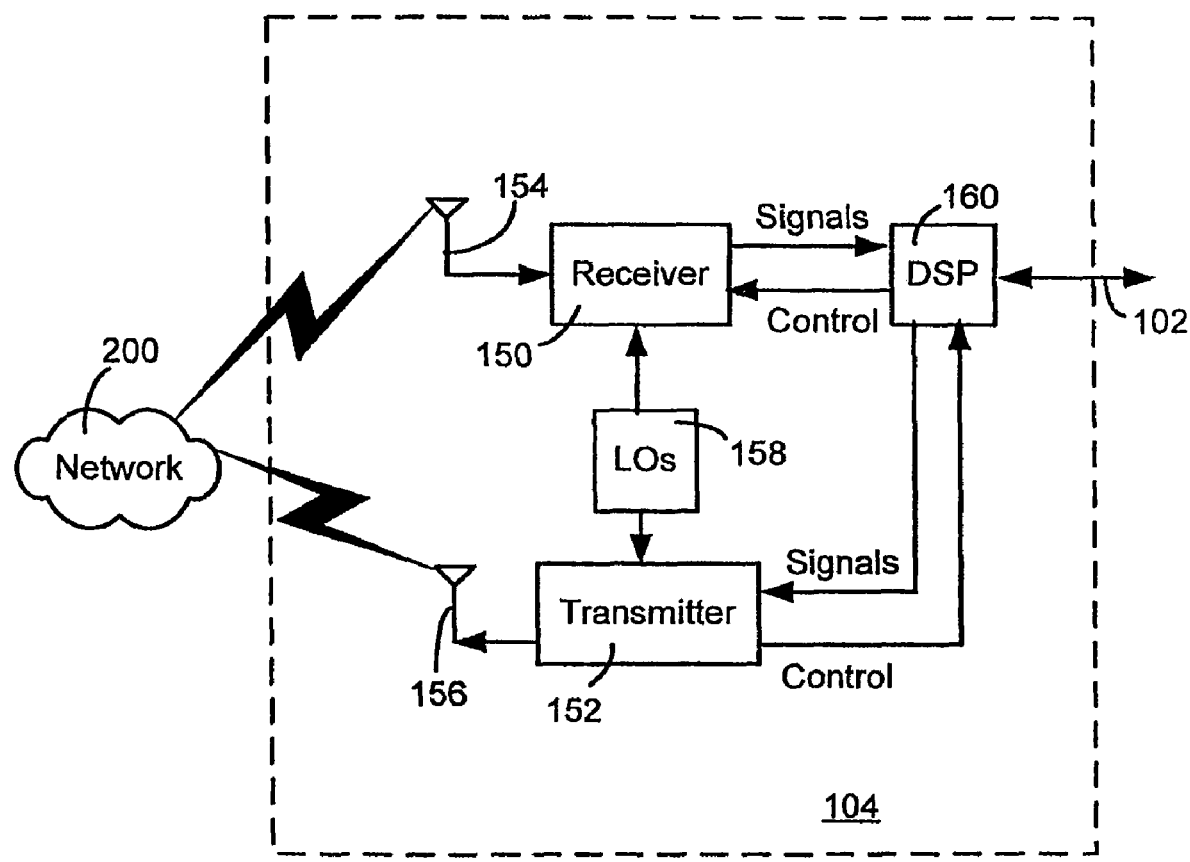
FIG. 2 is a block diagram of a communication subsystem component of the mobile device of FIG. 1.
Figure 3:
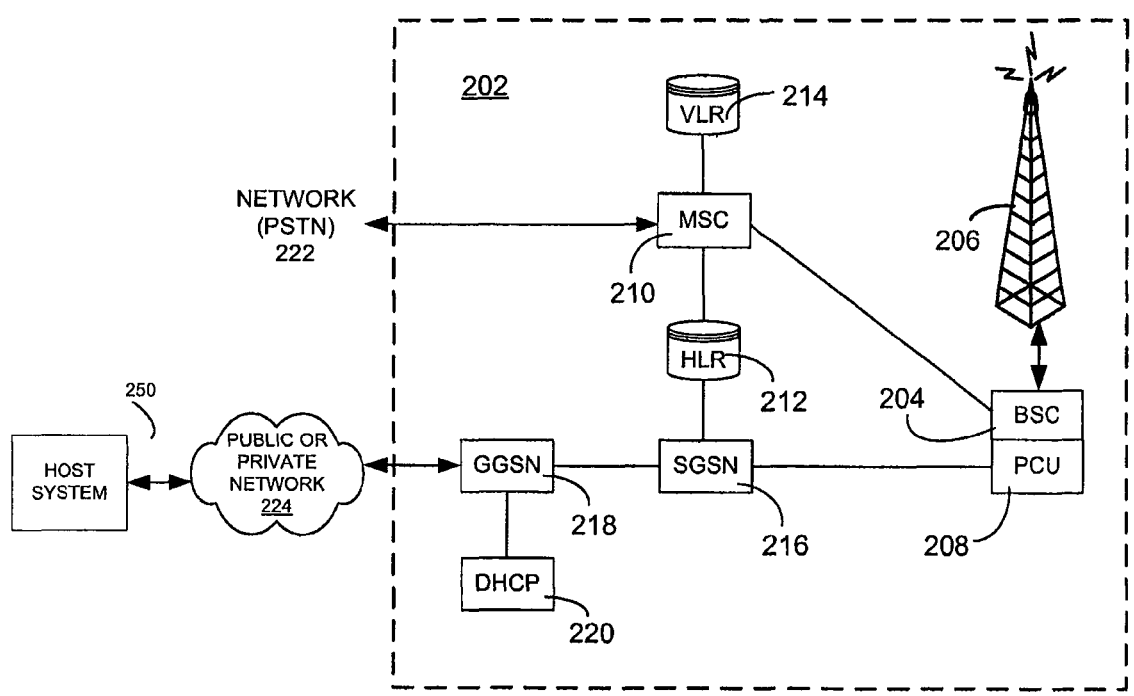
FIG. 3 is a block diagram of a node of a wireless network in one example implementation.

To aid the reader in understanding the structure of a mobile device and how it communicates with other devices, reference is made to FIGS. 1 through 3.

Referring first to FIG. 1, a block diagram of a mobile device in one example implementation is shown generally as 100. Mobile device 100 comprises a number of components, the controlling component being microprocessor 102. Microprocessor 102 controls the overall operation of mobile device 100. Communication functions, including data and voice communications, are performed through communication subsystem 104. Communication subsystem 104 receives messages from and sends messages to a wireless network 200. In this example implementation of mobile device 100, communication subsystem 104 is configured in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS). New standards are still being defined, but it is believed that they will have similarities to the network behavior described herein, and it will also be understood by persons skilled in the art that embodiments are intended to use any other suitable standards that are developed in the future. The wireless link connecting communication subsystem 104 with network 200 represents one or more different Radio Frequency (RF) channels, operating according to defined protocols specified for GSM/GPRS communications. With newer network protocols, these channels are capable of supporting both circuit switched voice communications and packet switched data communications.

Although the wireless network associated with mobile device 100 is a GSM/GPRS wireless network in one example implementation of mobile device 100, other wireless networks may also be associated with mobile device 100 in variant implementations. Different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA2000 networks, GSM/GPRS networks (as mentioned above), and future third-generation (3G) networks like EDGE and UMTS. Some older examples of data-centric networks include the Mobitex™ Radio Network and the DataTAC™ Radio Network. Examples of older voice-centric data networks include Personal Communication Systems (PCS) networks like GSM and Time Division Multiple Access (TDMA) systems. Other network communication technologies that may be employed include, for example, Integrated Digital Enhanced Network (iDEN™), Evolution-Data Optimized (EV-DO), and High Speed Downlink Packet Access (HSDPA).

Microprocessor 102 also interacts with additional subsystems such as a Random Access Memory (RAM) 106, flash memory 108, display 110, auxiliary input/output (I/O) subsystem 112, data port 114, keyboard 116, speaker 118, microphone 120, short-range communications 122 and other devices 124.

Some of the subsystems of mobile device 100 perform communication-related functions, whereas other subsystems may provide "resident" or on-device functions. By way of example, display 110 and keyboard 116 may be used for both communication-related functions, such as entering a text message for transmission over network 200, and device-resident functions such as a calculator or task list. Operating system software used by microprocessor 102 is typically stored in a persistent store such as flash memory 108, which may alternatively be a read-only memory (ROM) or similar storage element (not shown). Those skilled in the art will appreciate that the operating system, specific device applications, or parts thereof, may be temporarily loaded into a volatile store such as RAM 106.

Mobile device 100 may send and receive communication signals over network 200 after required network registration or activation procedures have been completed. Network access is associated with a subscriber or user of a mobile device 100. To identify a subscriber, mobile device 100 may require a Subscriber Identity Module or "SIM" card 126 to be inserted in a SIM interface 128 in order to communicate with a network. SIM 126 is one type of a conventional "smart card" used to identify a subscriber of mobile device 100 and to personalize the mobile device 100, among other things. Without SIM 126, mobile device 100 is not fully operational for communication with network 200. By inserting SIM 126 into SIM interface 128, a subscriber can access all subscribed services. Services could include: web browsing and messaging such as e-mail, voice mail, Short Message Service (SMS), and Multimedia Messaging Services (MMS). More advanced services may include: point of sale, field service and sales force automation. SIM 126 includes a processor and memory for storing information. Once SIM 126 is inserted in SIM interface 128, it is coupled to microprocessor 102. In order to identify the subscriber, SIM 126 contains some user parameters such as an International Mobile Subscriber Identity (IMSI). An advantage of using SIM 126 is that a subscriber is not necessarily bound by any single physical mobile device. SIM 126 may store additional subscriber information for a mobile device as well, including datebook (or calendar) information and recent call information.

Mobile device 100 includes a battery interface 132 for receiving one or more batteries 130. The battery 130 may be rechargeable. Battery interface 132 is coupled to a regulator (not shown), which assists battery 130 in providing power V+ to mobile device 100. Although current technology makes use of a battery, future technologies such as micro fuel cells may provide the power to mobile device 100.

Microprocessor 102, in addition to its operating system functions, enables execution of software applications on mobile device 100. A set of applications that control basic device operations, including data and voice communication applications, will normally be installed on mobile device 100 during its manufacture. Another application that may be loaded onto mobile device 100 would be a personal information manager (PIM). A PIM has functionality to organize and manage data items of interest to a subscriber, such as, but not limited to, e-mail, calendar events, voice mails, appointments, and task items. A PIM application has the ability to send and receive data items via wireless network 200. PIM data items may be seamlessly integrated, synchronized, and updated via wireless network 200 with the mobile device subscriber's corresponding data items stored and/or associated with a host computer system. This functionality creates a mirrored host computer on mobile device 100 with respect to such items. This can be particularly advantageous where the host computer system is the mobile device subscriber's office computer system.

Additional applications may also be loaded onto mobile device 100 through network 200, auxiliary I/O subsystem 112, data port 114, short-range communications subsystem 122, or any other suitable subsystem 124. This flexibility in application installation increases the functionality of mobile device 100 and may provide enhanced on-device functions, communication-related functions, or both. For example, secure communication applications may enable electronic commerce functions and other such financial transactions to be performed using mobile device 100.

Data port 114 enables a subscriber to set preferences through an external device or software application and extends the capabilities of mobile device 100 by providing for information or software downloads to mobile device 100 other than through a wireless communication network. The alternate download path may, for example, be used to load an encryption key onto mobile device 100 through a direct and thus reliable and trusted connection to provide secure device communication. Data port 114 may be a suitable port that enables data communication between the mobile device 100 and another computing device. For example, the data port 114 may be a serial or parallel port and may also include a power line to provide power to the mobile device 100, as is available with Universal Serial Bus (USB) ports.

Short-range communications subsystem 122 provides for communication between mobile device 100 and different systems or devices, without the use of network 200. For example, subsystem 122 may include an infrared device and associated circuits and components for short-range communication. Examples of short range communication would include standards developed by the Infrared Data Association (IrDA), Bluetooth, and the 802.11 family of standards developed by IEEE.

In use, a received signal such as a text message, an e-mail message, or web page download will be processed by communication subsystem 104 and input to microprocessor 102. Microprocessor 102 will then process the received signal for output to display 110 or alternatively to auxiliary I/O subsystem 112. A subscriber may also compose data items, such as e-mail messages, for example, using keyboard 116 in conjunction with display 110 and possibly auxiliary I/O subsystem 112. Auxiliary subsystem 112 may include devices such as: a touch screen, mouse, track ball, infrared fingerprint detector, or a roller wheel with dynamic button pressing capability. Keyboard 116 is an alphanumeric keyboard and/or telephone-type keypad. A composed item may be transmitted over network 200 through communication subsystem 104.

For voice communications, the overall operation of mobile device 100 is substantially similar, except that the received signals would be output to speaker 118, and signals for transmission would be generated by microphone 120. Alternative voice or audio I/O subsystems, such as a voice message recording subsystem, may also be implemented on mobile device 100. Although voice or audio signal output is accomplished primarily through speaker 118, display 110 may also be used to provide additional information such as the identity of a calling party, duration of a voice call, or other voice call related information.

Referring now to FIG. 2, a block diagram of the communication subsystem component 104 of FIG. 1 is shown. Communication subsystem 104 comprises a receiver 150, a transmitter 152, one or more embedded or internal antenna elements 154, 156, Local Oscillators (LOs) 158, and a processing module such as a Digital Signal Processor (DSP) 160.

The particular design of communication subsystem 104 is dependent upon the network 200 in which mobile device 100 is intended to operate, thus it should be understood that the design illustrated in FIG. 2 serves only as one example. Signals received by antenna 154 through network 200 are input to receiver 150, which may perform such common receiver functions as signal amplification, frequency down conversion, filtering, channel selection, and analog-to-digital (A/D) conversion. A/D conversion of a received signal allows more complex communication functions such as demodulation and decoding to be performed in DSP 160. In a similar manner, signals to be transmitted are processed, including modulation and encoding, by DSP 160. These DSP-processed signals are input to transmitter 152 for digital-to-analog (D/A) conversion, frequency up conversion, filtering, amplification and transmission over network 200 via antenna 156. DSP 160 not only processes communication signals, but also provides for receiver and transmitter control. For example, the gains applied to communication signals in receiver 150 and transmitter 152 may be adaptively controlled through automatic gain control algorithms implemented in DSP 160.

The wireless link between mobile device 100 and a network 200 may contain one or more different channels, typically different RF channels, and associated protocols used between mobile device 100 and network 200. A RF channel is a limited resource that must be conserved, typically due to limits in overall bandwidth and limited battery power of mobile device 100.

When mobile device 100 is fully operational, transmitter 152 is typically keyed or turned on only when it is sending to network 200 and is otherwise turned off to conserve resources. Similarly, receiver 150 is periodically turned off to conserve power until it is needed to receive signals or information (if at all) during designated time periods.

Referring now to FIG. 3, a block diagram of a node of a wireless network is shown as 202. In practice, network 200 comprises one or more nodes 202. Mobile device 100 communicates with a node 202 within wireless network 200. In the example implementation of FIG. 3, node 202 is configured in accordance with General Packet Radio Service (GPRS) and Global Systems for Mobile (GSM) technologies. Node 202 includes a base station controller (BSC) 204 with an associated tower station 206, a Packet Control Unit (PCU) 208 added for GPRS support in GSM, a Mobile Switching Center (MSC) 210, a Home Location Register (HLR) 212, a Visitor Location Registry (VLR) 214, a Serving GPRS Support Node (SGSN) 216, a Gateway GPRS Support Node (GGSN) 218, and a Dynamic Host Configuration Protocol (DHCP) 220. This list of components is not meant to be an exhaustive list of the components of every node 202 within a GSM/GPRS network, but rather a list of components that are commonly used in communications through network 200.

In a GSM network, MSC 210 is coupled to BSC 204 and to a landline network, such as a Public Switched Telephone Network (PSTN) 222 to satisfy circuit switched requirements. The connection through PCU 208, SGSN 216 and GGSN 218 to the public or private network (Internet) 224 (also referred to herein generally as a shared network infrastructure) represents the data path for GPRS capable mobile devices. In a GSM network extended with GPRS capabilities, BSC 204 also contains a Packet Control Unit (PCU) 208 that connects to SGSN 216 to control segmentation, radio channel allocation and to satisfy packet switched requirements. To track mobile device location and availability for both circuit switched and packet switched management, HLR 212 is shared between MSC 210 and SGSN 216. Access to VLR 214 is controlled by MSC 210.

Station 206 is a fixed transceiver station. Station 206 and BSC 204 together form the fixed transceiver equipment. The fixed transceiver equipment provides wireless network coverage for a particular coverage area commonly referred to as a "cell". The fixed transceiver equipment transmits communication signals to and receives communication signals from mobile devices within its cell via station 206. The fixed transceiver equipment normally performs such functions as modulation and possibly encoding and/or encryption of signals to be transmitted to the mobile device in accordance with particular, usually predetermined, communication protocols and parameters, under control of its controller. The fixed transceiver equipment similarly demodulates and possibly decodes and decrypts, if necessary, any communication signals received from mobile device 100 within its cell. Communication protocols and parameters may vary between different nodes. For example, one node may employ a different modulation scheme and operate at different frequencies than other nodes.

For all mobile devices 100 registered with a specific network, permanent configuration data such as a user profile is stored in HLR 212. HLR 212 also contains location information for each registered mobile device and can be queried to determine the current location of a mobile device. MSC 210 is responsible for a group of location areas and stores the data of the mobile devices currently in its area of responsibility in VLR 214. Further VLR 214 also contains information on mobile devices that are visiting other networks. The information in VLR 214 includes part of the permanent mobile device data transmitted from HLR 212 to VLR 214 for faster access. By moving additional information from a remote HLR 212 node to VLR 214, the amount of traffic between these nodes can be reduced so that voice and data services can be provided with faster response times and at the same time requiring less use of computing resources.

SGSN 216 and GGSN 218 are elements added for GPRS support; namely packet switched data support, within GSM. SGSN 216 and MSC 210 have similar responsibilities within wireless network 200 by keeping track of the location of each mobile device 100. SGSN 216 also performs security functions and access control for data traffic on network 200. GGSN 218 provides internetworking connections with external packet switched networks and connects to one or more SGSN's 216 via an Internet Protocol (IP) backbone network operated within the network 200. During normal operations, a given mobile device 100 must perform a "GPRS Attach" to acquire an IP address and to access data services. This requirement is not present in circuit switched voice channels as Integrated Services Digital Network (ISDN) addresses are used for routing incoming and outgoing calls. Currently, all GPRS capable networks use private, dynamically assigned IP addresses, thus requiring a DHCP server 220 connected to the GGSN 218. There are many mechanisms for dynamic IP assignment, including using a combination of a Remote Authentication Dial-In User Service (RADIUS) server and DHCP server. Once the GPRS Attach is complete, a logical connection is established from a mobile device 100, through PCU 208, and SGSN 216 to an Access Point Node (APN) within GGSN 218. The APN represents a logical end of an IP tunnel that can either access direct Internet compatible services or private network connections. The APN also represents a security mechanism for network 200, insofar as each mobile device 100 must be assigned to one or more APNs and mobile devices 100 cannot exchange data without first performing a GPRS Attach to an APN that it has been authorized to use. The APN may be considered to be similar to an Internet domain name such as "myconnection.wireless.com".

Once the GPRS Attach is complete, a tunnel is created and all traffic is exchanged within standard IP packets using any protocol that can be supported in IP packets. This includes tunneling methods such as IP over IP as in the case with some IPSecurity (Ipsec) connections used with Virtual Private Networks (VPN). These tunnels are also referred to as Packet Data Protocol (PDP) Contexts and there are a limited number of these available in the network 200. To maximize use of the PDP Contexts, network 200 will run an idle timer for each PDP Context to determine if there is a lack of activity. When a mobile device 100 is not using its PDP Context, the PDP Context can be deallocated and the IP address returned to the IP address pool managed by DHCP server 220.

Figure 4:
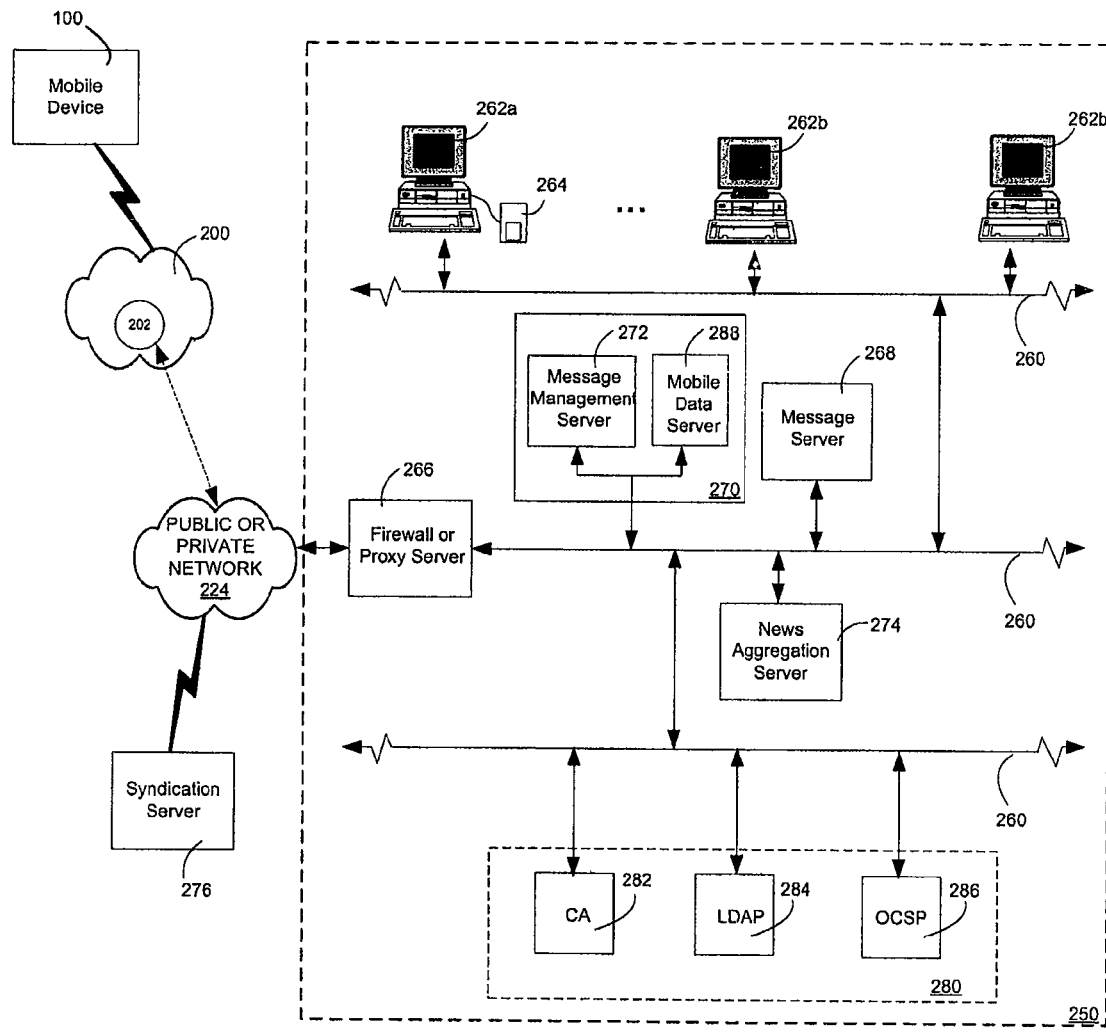
FIG. 4 is a block diagram illustrating components of a host system in one example implementation.

Referring now to FIG. 4, a block diagram illustrating components of a host system in one example configuration is shown. Host system 250 will typically be a corporate office or other local area network (LAN), but may instead be a home office computer or some other private system, for example, in variant implementations. In this example shown in FIG. 4, host system 250 is depicted as a LAN of an organization to which a user of mobile device 100 belongs.

LAN 250 comprises a number of network components connected to each other by LAN connections 260. For instance, a user's desktop computer 262a with an accompanying cradle 264 for the user's mobile device 100 is situated on LAN 250. Cradle 264 for mobile device 100 may be coupled to computer 262a by a serial or a Universal Serial Bus (USB) connection, for example. Other user computers 262b are also situated on LAN 250, and each may or may not be equipped with an accompanying cradle 264 for a mobile device. Cradle 264 facilitates the loading of information (e.g. PIM data, private symmetric encryption keys to facilitate secure communications between mobile device 100 and LAN 250) from user computer 262a to mobile device 100, for example, through data port 114, and may be particularly useful for bulk information updates often performed in initializing mobile device 100 for use. The information downloaded to mobile device 100 may include certificates used in the exchange of messages. It will be understood by persons skilled in the art that the cradle 264 is not required to connect the mobile device 100 to the computer 262a and that computers 262a, 262b will typically also be connected to other peripheral devices not explicitly shown in FIG. 4.

Furthermore, only a subset of network components of LAN 250 are shown in FIG. 4 for ease of exposition, and it will be understood by persons skilled in the art that LAN 250 will generally comprise additional components not explicitly shown in FIG. 4, for this example configuration. More generally, LAN 250 may represent a smaller part of a larger network [not shown] of the organization, and may comprise different components and/or be arranged in different topologies than that shown in the example of FIG. 4.

In this example, mobile device 100 communicates with LAN 250 through a node 202 of wireless network 200 and a shared network infrastructure 224 such as a service provider network or the public Internet. Access to LAN 250 may be provided through one or more routers [not shown], and computing devices of LAN 250 may operate from behind a firewall or proxy server 266.

In a variant implementation, LAN 250 comprises a wireless VPN router [not shown] to facilitate data exchange between the LAN 250 and mobile device 100. The concept of a wireless VPN router is new in the wireless industry and implies that a VPN connection can be established directly through a specific wireless network to mobile device 100. The possibility of using a wireless VPN router has only recently been available and could be used when Internet Protocol (IP) Version 6 (IPV6) arrives into IP-based wireless networks. This new protocol will provide enough IP addresses to dedicate an IP address to every mobile device, making it possible to push information to a mobile device at any time. An advantage of using a wireless VPN router is that it could be an off-the-shelf VPN component, not requiring a separate wireless gateway and separate wireless infrastructure to be used. A VPN connection would preferably be a Transmission Control Protocol (TCP)/IP or User Datagram Protocol (UDP)/IP connection to deliver the messages directly to mobile device 100 in this variant implementation.

Messages intended for a user of mobile device 100 are initially received by a message server 268 of LAN 250. Such messages may originate from any of a number of sources. For instance, a message may have been sent by a sender from a computer 262b within LAN 250, from a different mobile device [not shown] connected to wireless network 200 or to a different wireless network, or from a different computing device or other device capable of sending messages, via the shared network infrastructure 224, and possibly through an application service provider (ASP) or Internet service provider (ISP), for example.

Message server 268 typically acts as the primary interface for the exchange of messages, particularly e-mail messages, within the organization and over the shared network infrastructure 224. Each user in the organization that has been set up to send and receive messages is typically associated with a user account managed by message server 268. One example of a message server 268 is a Microsoft Exchange™ Server. In some implementations, LAN 250 may comprise multiple message servers 268. Message server 268 may also be adapted to provide additional functions beyond message management, including the management of data associated with calendars and task lists, for example.

When messages are received by message server 268, they are typically stored in a message store [not explicitly shown], from which messages can be subsequently retrieved and delivered to users. For instance, an e-mail client application operating on a user's computer 262a may request the e-mail messages associated with that user's account stored on message server 268. These messages would then typically be retrieved from message server 268 and stored locally on computer 262a.

When operating mobile device 100, the user may wish to have e-mail messages retrieved for delivery to the handheld. An e-mail client application operating on mobile device 100 may also request messages associated with the user's account from message server 268. The e-mail client may be configured (either by the user or by an administrator, possibly in accordance with an organization's information technology (IT) policy) to make this request at the direction of the user, at some pre-defined time interval, or upon the occurrence of some pre-defined event. In some implementations, mobile device 100 is assigned its own e-mail address, and messages addressed specifically to mobile device 100 are automatically redirected to mobile device 100 as they are received by message server 268.

To facilitate the wireless communication of messages and message-related data between mobile device 100 and components of LAN 250, a number of wireless communications support components 270 may be provided. In this example implementation, wireless communications support components 270 comprise a message management server 272, for example. Message management server 272 is used to specifically provide support for the management of messages, such as e-mail messages, that are to be handled by mobile devices. Generally, while messages are still stored on message server 268, message management server 272 can be used to control when, if, and how messages should be sent to mobile device 100. Message management server 272 also facilitates the handling of messages composed on mobile device 100, which are sent to message server 268 for subsequent delivery.

For example, message management server 272 may: monitor the user's "mailbox" (e.g. the message store associated with the user's account on message server 268) for new e-mail messages; apply user-definable filters to new messages to determine if and how the messages will be relayed to the user's mobile device 100; compress and encrypt new messages (e.g. using an encryption technique such as Data Encryption Standard (DES), Triple DES or Advanced Encryption Standard (AES)) and push them to mobile device 100 via the shared network infrastructure 224 and wireless network 200; and receive messages composed on mobile device 100 (e.g. encrypted using Triple DES), decrypt and decompress the composed messages, re-format the composed messages if desired so that they will appear to have originated from the user's computer 262a, and re-route the composed messages to message server 268 for delivery.

Certain properties or restrictions associated with messages that are to be sent from and/or received by mobile device 100 can be defined (e.g. by an administrator in accordance with IT policy) and enforced by message management server 272. These may include whether mobile device 100 may receive encrypted and/or signed messages, minimum encryption key sizes, whether outgoing messages must be encrypted and/or signed, and whether copies of all secure messages sent from mobile device 100 are to be sent to a pre-defined copy address, for example.

Message management server 272 may also be adapted to provide other control functions, such as only pushing certain message information or pre-defined portions (e.g. "blocks") of a message stored on message server 268 to mobile device 100. For example, when a message is initially retrieved by mobile device 100 from message server 268, message management server 272 is adapted to push only the first part of a message to mobile device 100, with the part being of a pre-defined size (e.g. 2 KB). The user can then request more of the message, to be delivered in similar-sized blocks by message management server 272 to mobile device 100, possibly up to a maximum pre-defined message size.

Accordingly, message management server 272 facilitates better control over the type of data and the amount of data that is communicated to mobile device 100, and can help to minimize potential waste of bandwidth or other resources.

It will be understood by persons skilled in the art that message management server 272 need not be implemented on a separate physical server in LAN 250 or other network. For example, some or all of the functions associated with message management server 272 may be integrated with message server 268, or some other server in LAN 250. Furthermore, LAN 250 may comprise multiple message management servers 272, particularly in variant implementations where a large number of mobile devices needs to be supported.

Figure 5:
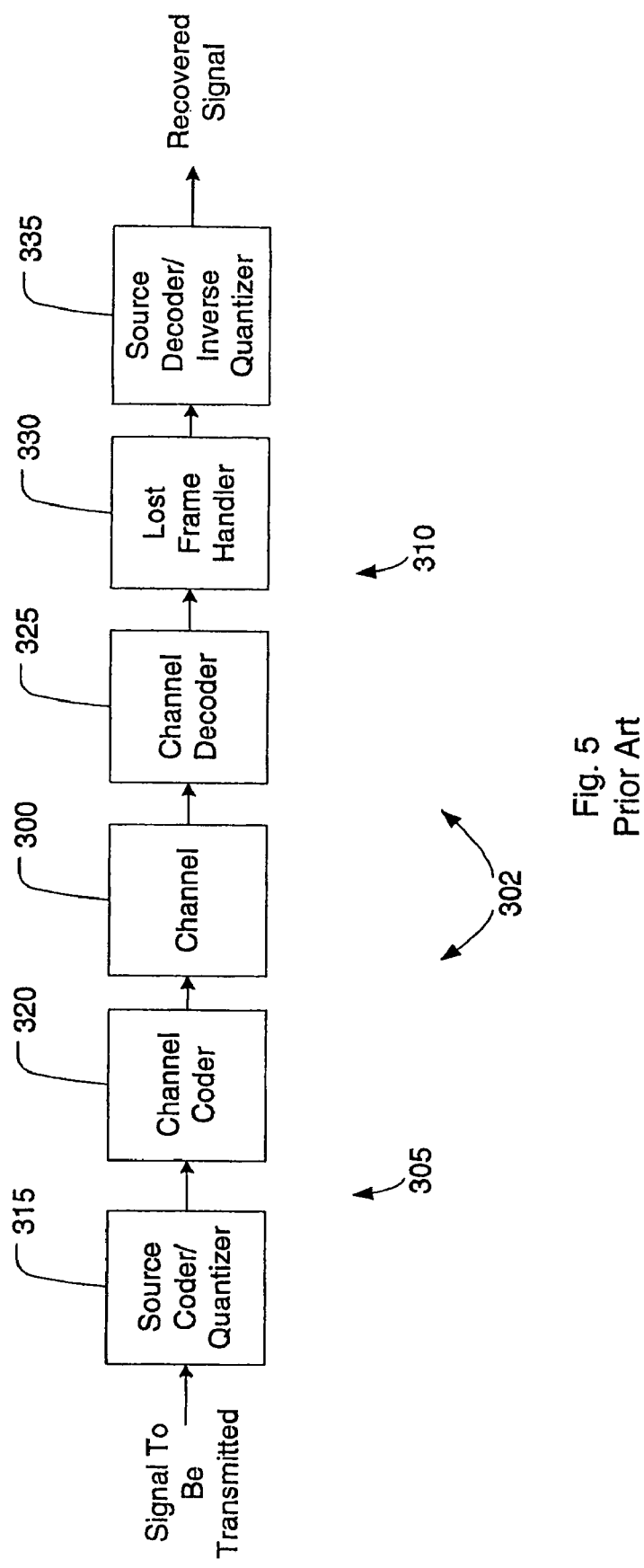
FIG. 5 illustrates a conventional system for coding and decoding a signal in a channel.

Having described the general mobile environment, the following description focuses on a channel in a communications system for communication among mobile devices 100. FIG. 5 is an illustration of such a channel 300 and a conventional coding system 302, such as that found in, for example, GSM systems using full rate (FR), adaptive multi-rate (AMR), and other types of coding. The coding system 302 includes systems for coding 305 and decoding 310 a signal to be transmitted and received through the channel 300. In the context of the mobile device 100, the systems for coding 305 or decoding 310 signals are included within, for example, DSP160.

As shown in FIG. 5, a signal to be transmitted, for example an analog voice signal, is provided to a source coder/quantizer 315, which quantizes and compresses the signal in order to reduce or remove redundancies in the signal. The source coder 315 outputs a sequence of bits or, in some exemplary embodiments, codewords. Codewords are a tool used in communications to represent a combination of bits that have been encoded for transmission. It will be understood that the signal to be transmitted can be any type of signal that can be quantized, including, for example, speech, still images, moving images, or the like. It will be understood that some distortion of the signal may occur during the quantization stage due to lossy compression or the like.

The source-coded signal is passed to a channel coder 320, which adds redundancy to compensate for errors introduced in the channel during transmission. The channel coder typically adds bits to the sequence to allow for error detection and correction, for example, forward error checking (FEC) and cyclical redundancy check (CRC). The output of the channel coder 320 is a series or sequence of bits. The signal may also be otherwise encoded using various methods including, for example, time domain multiple access (TDMA) signals, code domain multiple access (CDMA) signals, global system for mobile communications (GSM) signals, or other types of communications signals.

It will be understood by one of skill in the art that the source coder and channel coder may be implemented in hardware or software or some combination thereof. Further, either the source coder or the channel coder or the combination thereof may be referred to as an encoder.

The channel-coded signal then passes through the channel 300 where it may encounter interference, noise or other situations that lead to corruption of the bits that make up the signal.

The channel-coded signal is eventually received by a channel decoder 325 where the redundancy in the signal, such as the FEC and CRC information, is used to check for or correct errors in the signal and decode the channel-coded signal to a coded signal. At the channel decoder 325, the signal is received as a sequence of bit probabilities that represent the likelihood that a particular bit is a 1 or a 0. The channel decoder 325 uses, for example, FEC or other algorithms, such as soft-in, hard-out Viterbi, to convert the bit probabilities to a hard bit (i.e. either a 1 or a 0) or determines, based on the CRC or the like that a bit or codeword cannot be determined (i.e. is a lost frame) and outputs the hard bits.

The coded signal from the channel decoder 325 is passed to a lost frame handler 330, which then generates data to replace any lost frames in the received sequence. The lost frame handler 330 may use various Lost Frame Concealment (LFC) algorithms to replace a lost frame, for example, using the last good frame to replace a lost frame or the like.

The coded signal is then passed to a source decoder/inverse quantizer 335 for decoding to produce and output a recovered signal. In a codeword-based system, the source decoder 335 will typically use a table look-up to map the received codeword to a parameter value for output.

It will be understood by one of skill in the art that the channel decoder 325, lost frame handler 330 and source decoder 335 may be implemented in hardware or software or some combination thereof. Further, either the channel decoder 325 or the source decoder 335 or the combination thereof may be referred to as a decoder.

Figure 6:
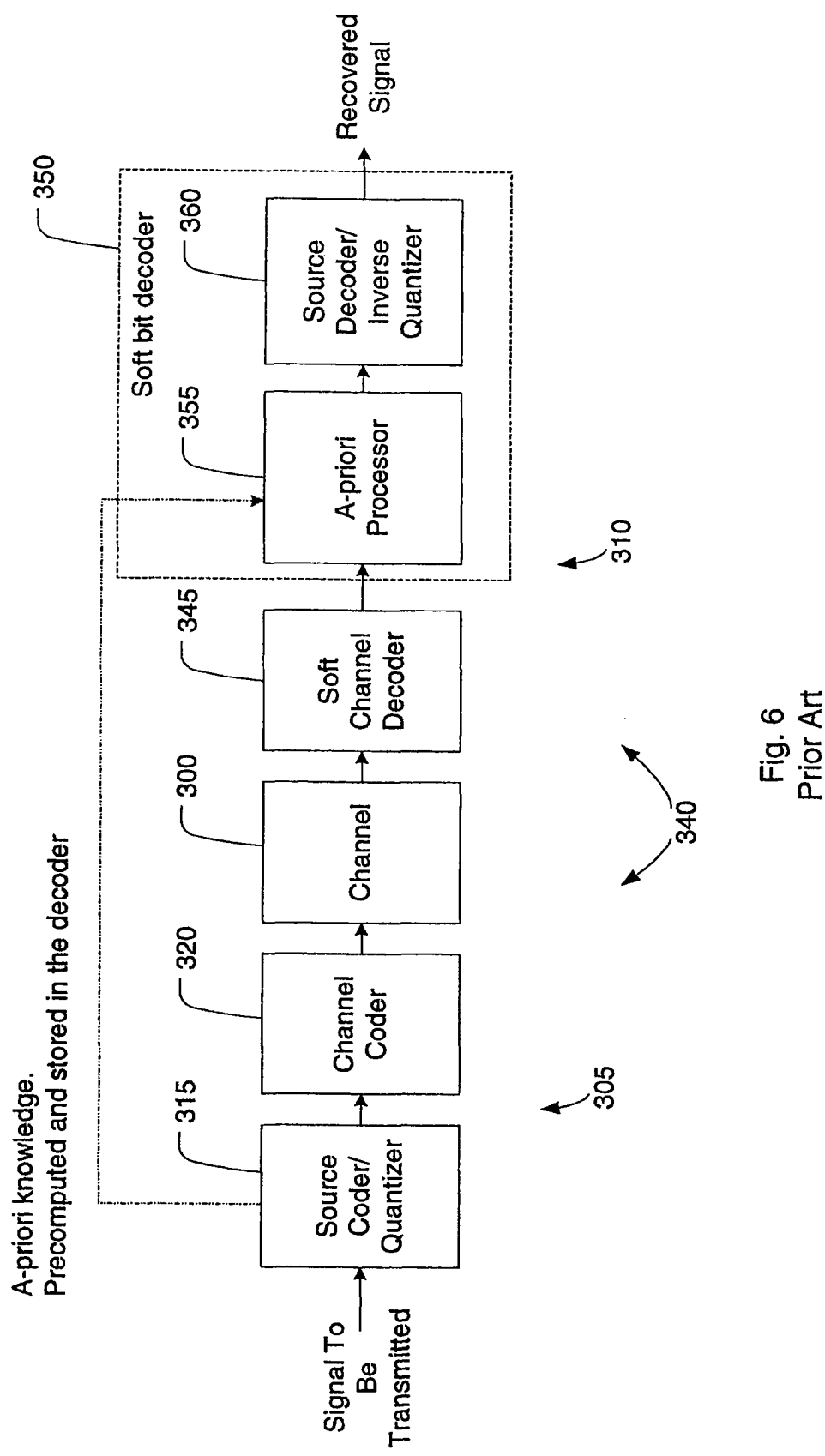
FIG. 6 illustrates a modified system in which decoding is facilitated by using soft decoding.

FIG. 6 shows a modified coding system 340 such as that used in some GSM systems, using, for example, FR or AMR soft bit decoding, in which elements of the decoding system 310 of FIG. 5 are altered. In particular, the channel decoder 325 of FIG. 5 is replaced with a soft channel decoder 345 and the lost frame handler 330 and the source decoder 335 of FIG. 5 are replaced with a soft bit decoder 350. The soft channel decoder 345 operates in a similar way to the channel decoder 325 of FIG. 5 and uses redundancy to check for or correct errors in the signal. However, rather than outputting a hard bit (i.e. a 1 or 0), the soft channel decoder 345 outputs a soft bit (i.e. a probability). Thus, the input is soft-bits (bit probabilities) and the output is also soft-bits. In a particular embodiment, the soft channel decoder 345 may include FEC decoding with a soft-in, soft-out MAP type decoder. Further, in this arrangement, the CRC may be ignored.

In this coding system 340, the soft bits output from the soft channel decoder 345 are input to an a-priori processor 355 in the soft bit decoder 350. The a-prior processor 355 includes information regarding parameters for the source coder 315, statistical information regarding the processing of the signal type by the source coder 315, information about the channel 300 and the like that has been determined in advance (referred to as a-priori knowledge). In operation, the a-priori processor 355 first adjusts the bit probabilities from the soft channel coder 345 based on the a-priori knowledge to compute adjusted probabilities. These adjusted probabilities are then provided to a soft source decoder 360, which uses the probabilities to determine codeword probabilities based on, for example, a most likely output using a maximum a-posteriori probability (MAP) approach, by weighting the potential outputs using a minimum mean square (MMS) approach or by some other method as would be known to one of skill in the art. The recovered signal is then output from the soft bit decoder 350.

Figure 7:
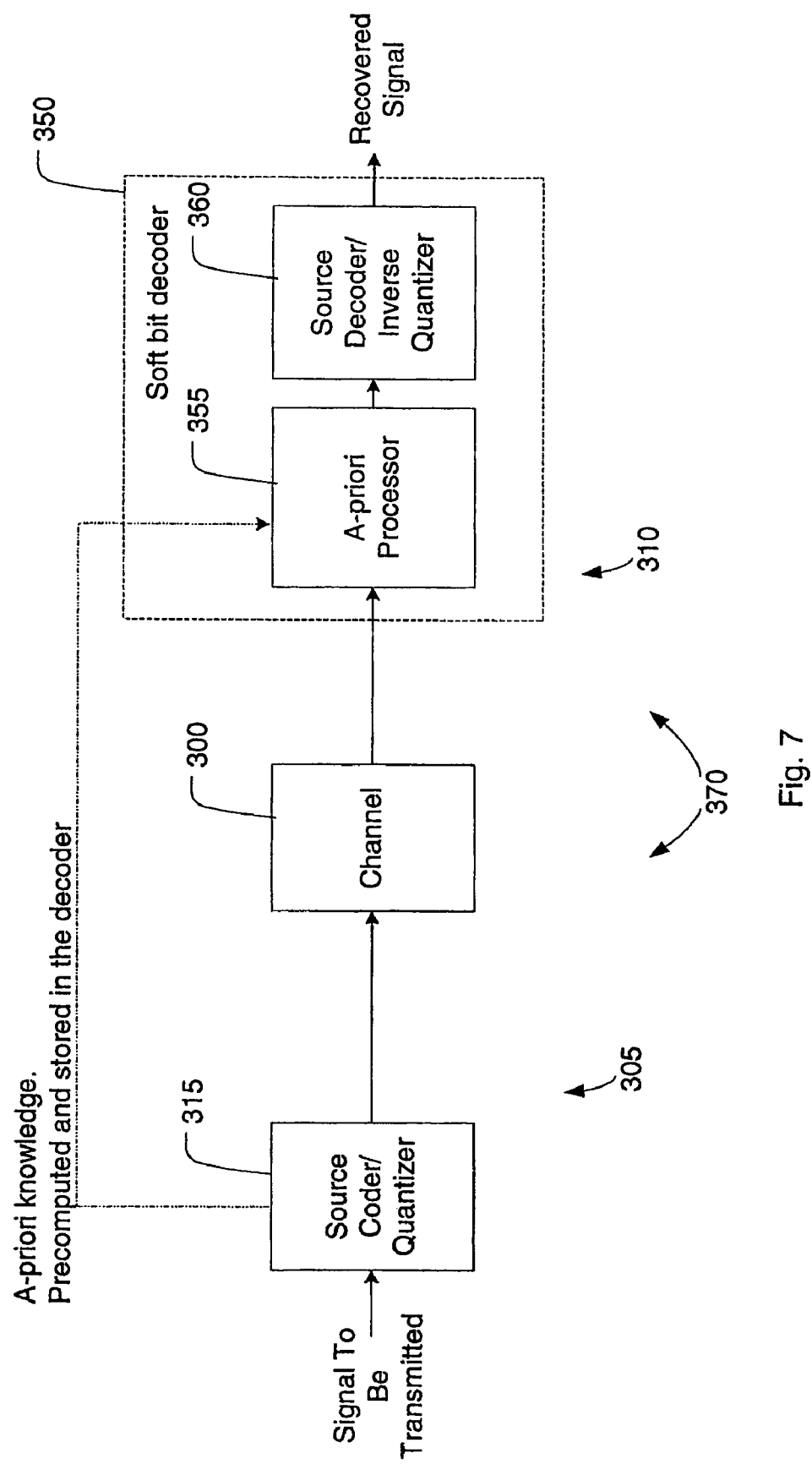
FIG. 7 illustrates a further modified system according to an exemplary embodiment.

FIG. 7 shows a further modified coding system 370 according to an exemplary embodiment. As shown in FIG. 7, the coding system 370 is similar to the coding system 340 of FIG. 6 except the channel coder 320 and soft channel decoder 345 of FIG. 6 have been removed. Although one of skill in the art would anticipate that this would reduce signal quality, the use of a-priori knowledge at the soft bit decoder 350 is expected to provide either similar quality with a reduced number of bits in the signal or greater quality while using the same number of bits in the signal as would be available in a conventional system that includes channel coder bits.

As shown in FIG. 7, a signal to be transmitted is quantized by the source coder 315 and redundancies are removed to output a sequence of bits or, in some exemplary embodiments, a sequence of codewords represented as bits. As in the coding system 340 described above with regard to FIG. 6, the a-priori processor 355 in the soft bit decoder 350 includes a-priori information that may include parameters for the source coder 315, statistical information regarding the processing of the signal type by the source coder 315, and the like.

The coded signal is then sent through the channel 300, where it may be corrupted.

The coded signal is then received by the soft bit decoder 350 where the a-priori processor 355 combines bit probabilities with the a-priori knowledge discussed herein to produce bit/codeword probabilities. The bit/codeword probabilities are then passed to the source decoder 360 to recover the signal. As described above, the bit/codeword probabilities can be recovered using, for example, MAP decoding or MMS decoding.

The a-priori knowledge provided to the soft bit decoder 350 will preferably include information related to the probability distribution of bits/codewords being sent from the source coder 315. The probability distribution may also be specified for a given type of signal. For example, the probability distribution may vary as between a speech signal and a data signal such as that for an image or motion image. In an exemplary embodiment, the soft bit decoder 350 may include tables reflecting one or more of these probability distributions. As described above, the a-priori knowledge preferrably includes as much information about the elements in the communication system as possible and it may be preferrable to include additional information related to the communications channel or the like. One of skill in the art will understand the various techniques used to develop a-priori knowledge/information and probability distributions. For example, probability distributions can be prepared/calculated by sending a predetermined number of signals (predetermined amount of data) through an encoder, channel, decoder system and performing a statistical analysis on the reception results.

Figure 8:
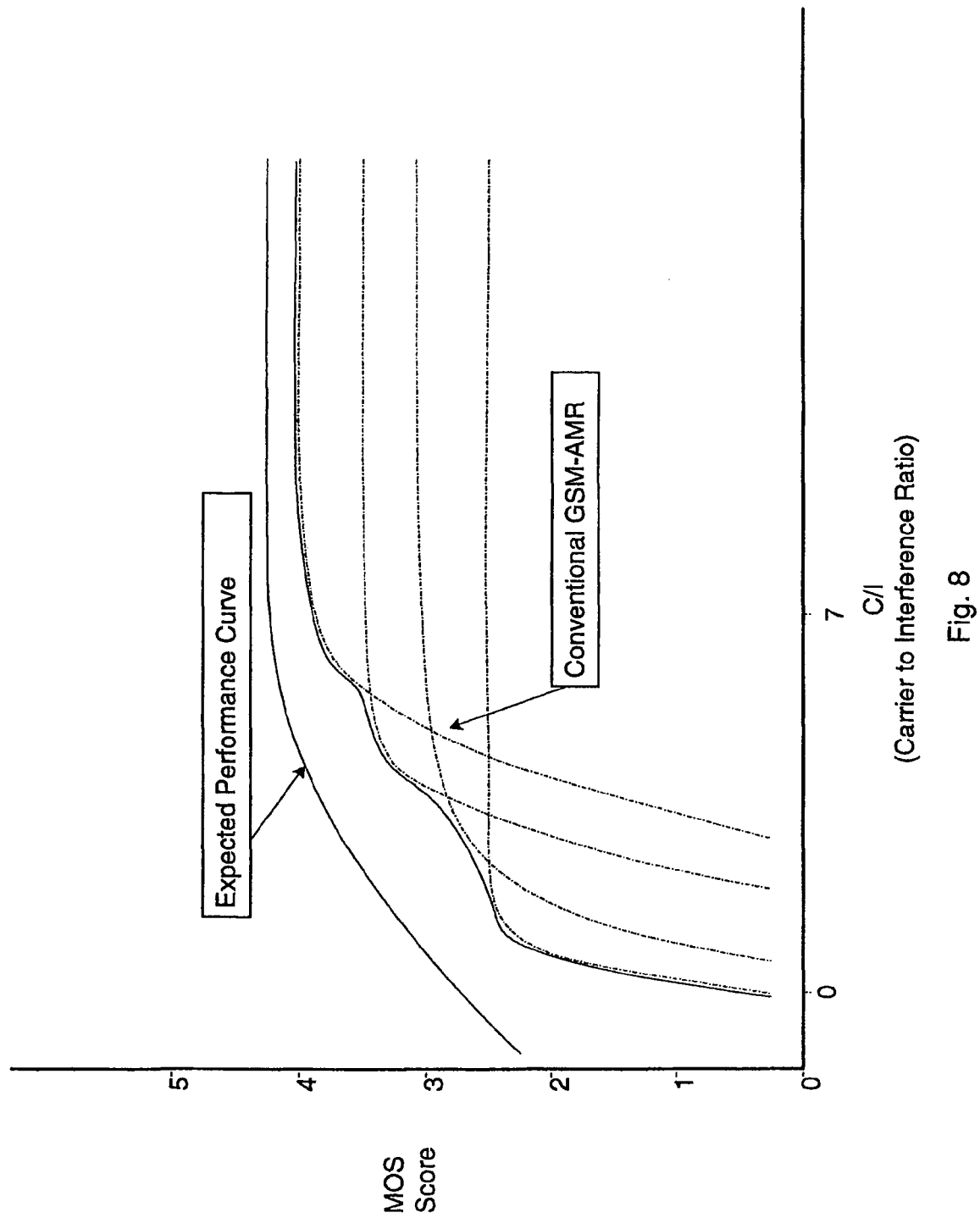
FIG. 8 illustrates the anticipated effect of the system of FIG. 7 as compared to the system of FIG. 5 using GSM AMR coding.

FIG. 8 illustrates the projected improvement in signal quality at increased interference levels that is expected from embodiments making use of the techniques disclosed herein. In particular, the y-axis represents mean opinion score (MOS), a measure of perceived signal quality for voice, and the x-axis represents carrier to interference ratio (C/I), which is a measure of the amount of corruption introduced by the channel. As shown, a conventional system similar to that in FIG. 5 utilizing AMR, typically has a very pronounced fall off in signal quality as interference increases. In this example of AMR, each dashed curve shows a separate coding system (sometimes called a "vocoder") within the GSM AMR. The network then controls "rate" switching (i.e. choosing a vocoder) to improve performance at low C/I so that the user experiences performance shown by the solid line. This approach typically uses ad-hoc Lost Frame Concealment algorithms and FEC at all rates, thus reducing quality at high C/I (i.e. less interference). On the other hand, it is projected that a system according to an exemplary embodiment such as that illustrated in FIG. 7 will provide better performance at both high C/I (lower interference) and lower C/I (higher interference). The better performance at high C/I is due to the removal of the additional bits that are typically added during channel coding and the corresponding increased capacity for signal redundancy that can be provided for when using the same amount of bandwidth (that is, the signal does not need to be compressed as much at the source coder 315 because space is not required for the channel coding bits). The better performance at lower C/I is due to the use of soft bit decoding (including a-priori information) to provide error correction and lost frame concealment. Further, the use of embodiments such as that in FIG. 7 will reduce or eliminate the need for complex AMR type control/switching algorithms or the like.

Thus, embodiments of the system and method are intended to provide improved voice quality for the mobile device 100 (e.g. a GSM handset) under both good and poor channel conditions. More specifically, these embodiments are intended to improve decoder performance for quantized data when there is data corruption on a channel (data link) and allow for a reduction in the distortion introduced by quantization when there is no data corruption on the channel (data link).

As described above, the exemplary embodiments use soft bit decoding, that is, using bit probability estimates based on the source coder and channel to allow an a-priori processor at the soft bit decoder to compute codeword probabilities for input to the source decoder. The codeword probabilities can be used to:

generate the most likely output value from the source coder (maximum a-posteriori probability (MAP) decoding), or each codeword probability can be used to weight the corresponding source coder output (minimum mean square (MMS) decoding).

While the use of a-priori statistical information about the quantized signal can add extra computations at the decoder system, embodiments using these techniques allow for flexibility such that the coding system can efficiently trade off resources versus decoding quality.

A further benefit is that MMS decoding naturally "mutes" the output when all codewords have the same probability (all bits equally likely to be either 1 or 0). This is a desirable feature when dealing with low quality data from the channel because, particularly in voice applications, producing silence is better than producing noise when there is a large uncertainly in the received data.

When there is no or little data corruption on the channel, the signal can be improved by avoiding the need to allocate part of the communication bandwidth on the channel to error correction, such as Forward Error Correction (FEC). The extra bandwidth (bits) can be used to reduce the distortion introduced by the quantization-process at the encoder. Overall, the soft decoding process is expected to be better than FEC at combating the effects of data corruption on the channel and more than make up for the missing FEC decoding at the receiver. Alternatively, instead of increasing the voice quality, the freed up bits (or capacity) from not having to apply and send the FEC bits can be used to improve the overall network capacity. This would allow for more users to use the valuable radio spectrum.

Further, some embodiments avoid the need to design and test ad-hoc and complex algorithms for lost-frame-substitution with streaming signals (e.g. phone calls, etc.). In general, no special modes, states or thresholds are required to be added to the decoding process to deal With lost frame situations. Also with good quality data from the channel, it is possible for bit-exact results from the decoding process to be retained. This is important for many voice decoders as this is the method by which conformance is determined.

Still further, some embodiments avoid the need for complex control loops to perform adaptation of bits allocated for "source coding [quantization]" and "channel coding [FEC]". An example of an existing system that uses a complex control loop is GSM's AMR voice codec. In particular, no hard trade-offs need to be made based on the channel conditions. Rather the soft bit decoding automatically adjusts based on the channel conditions as the channel conditions can be reflected in the received signal statistics.

It will be further understood that the system and method of coding and decoding signals described above may be implemented as either hardware or software or some combination thereof. Further, methods and software may be implemented as executable software instructions stored on computer-readable media, which may include transmission-type media, which may be executed in a computer.

A number of embodiments have been described, however, it will be understood by persons skilled in the art that other variants and modifications may be made without departing from the scope of the claims appended hereto.

We claim:

1. A method for coding and decoding an information signal sent through a communication system comprising:

preparing a-priori information related to the communication system;

receiving an information signal;

encoding the information signal at an encoder without adding additional information, wherein encoding the information signal without adding additional information comprises source coding without channel coding, wherein source coding comprises removing redundancies in the information signal;

sending the encoded information signal through a channel of the communication system;

receiving the encoded information signal at a soft bit decoder;

applying the a-priori information to the received encoded information signal to produce soft-bit probabilities; and decoding the soft-bit probabilities.

2. The method of claim 1, wherein the a-priori information related to the communication system comprises a-priori knowledge related to one or more of the encoder, the channel, and a signal type of the information signal.

3. The method of claim 1, wherein the a-priori information comprises a probability distribution related to the encoder.

4. The method of claim 3, wherein the probability distribution comprises a table of probabilities.

5. The method of claim 1, wherein the encoding the information signal without adding additional information comprises encoding the information signal without forward error correction information.

6. The method of claim 1, wherein the decoding the soft-bit probabilities comprises selecting the most likely decoder output based on maximum a-posteriori probability.

7. The method of claim 1, wherein the decoding the soft-bit probabilities comprises selecting the most likely decoder output based on minimum mean square.

8. A system for coding and decoding an information signal sent through a communication system comprising:
   an encoder for encoding the information signal without adding additional information and for sending an encoded information signal, wherein encoding the information signal without adding additional information comprises performing source coding without channel coding, wherein the source coding comprises removing redundancies in the information signal; and
   a soft bit decoder comprising a-priori information related to the communication system for receiving the encoded information signal and decoding the encoded information signal using the a-priori information;
   wherein the soft bit decoder comprises an a-priori processor for applying the a-priori information to the received encoded information signal to produce soft-bit probabilities, and a source decoder for decoding the soft-bit probabilities.

9. The system of claim 8, wherein the a-priori information related to the communication system comprises a-priori knowledge related to one or more of the encoder, the channel, and a signal type of the information signal.

10. The system of claim 8, wherein the a-priori information comprises a probability distribution related to the encoder.

11. The system of claim 10, wherein the probability distribution comprises a table of probabilities.

12. The system of claim 8, wherein the encoder is arranged to encode the information signal without adding additional information by encoding the information signal without forward error correction information.

13. The system of claim 8, wherein the source decoder is arranged to decode the soft-bit probabilities by selecting the most likely decoder output based on maximum a-posteriori probability.

14. The system of claim 8, wherein the source decoder is arranged to decode the soft-bit probabilities by selecting the most likely decoder output based on minimum mean square.

* * * * *